(12) United States Patent
Roeder et al.

(10) Patent No.: US 12,551,723 B2
(45) Date of Patent: Feb. 17, 2026

(54) REMOTE CONTROL OF RADIATION THERAPY MEDICAL DEVICE

(71) Applicant: CARL ZEISS MEDITEC AG, Jena (DE)

(72) Inventors: Norman Roeder, Döbritschen (DE); Frank Weigand, Heidenheim (DE)

(73) Assignee: CARL ZEISS MEDITEC AG, Jena (DE)

( * ) Notice: Subject to any disclaimer, the term of this patent is extended or adjusted under 35 U.S.C. 154(b) by 0 days.

(21) Appl. No.: 19/101,250

(22) PCT Filed: Aug. 7, 2023

(86) PCT No.: PCT/EP2023/071830
§ 371 (c)(1),
(2) Date: Feb. 4, 2025

(87) PCT Pub. No.: WO2024/028518
PCT Pub. Date: Feb. 8, 2024

(65) Prior Publication Data
US 2025/0256127 A1    Aug. 14, 2025

(30) Foreign Application Priority Data
Aug. 5, 2022   (EP) ..................................... 22189029

(51) Int. Cl.
*G16H 40/67*   (2018.01)
*A61N 5/10*   (2006.01)

(52) U.S. Cl.
CPC .......... *A61N 5/1048* (2013.01); *G16H 40/67* (2018.01); *A61N 2005/1074* (2013.01)

(58) Field of Classification Search
CPC .......... A61N 5/1048; A61N 5/10; A61N 5/00; A61N 2005/1074; G16H 40/67; G16H 40/63; G16H 40/60; G16H 40/40; G16H 40/20; G16H 40/00
See application file for complete search history.

(56) References Cited

U.S. PATENT DOCUMENTS

| 2013/0225999 | A1 | 8/2013 | Banjanin et al. |
| 2015/0065989 | A1 | 3/2015 | Moberg et al. |
| 2019/0046813 | A1 | 2/2019 | Zhou et al. |
| 2019/0175941 | A1* | 6/2019 | Miyazaki ............. A61B 6/5217 |
| 2019/0336795 | A1 | 11/2019 | Zhou et al. |
| 2020/0060773 | A1 | 2/2020 | Barral et al. |

(Continued)

FOREIGN PATENT DOCUMENTS

| CN | 109416942 A | 3/2019 |
| WO | 2016106505 A1 | 7/2016 |

OTHER PUBLICATIONS

European Search Report for Application No. 22189029.6, mailed Apr. 4, 2023 (15 pages).

(Continued)

*Primary Examiner* — Mohamed Charioui
(74) *Attorney, Agent, or Firm* — NIXON PEABODY LLP; Jeffrey L. Costellia

(57) ABSTRACT

Various examples of the disclosure pertain to remote control of a radiation therapy medical device using an application that is executed by a server. A digital twin of the radiation therapy medical device may be maintained at the application that is executed by the server.

17 Claims, 5 Drawing Sheets

(56) References Cited

U.S. PATENT DOCUMENTS

2020/0360731 A1* 11/2020 Tilly ...................... G16H 30/40
2021/0069527 A1*  3/2021 Peltola ................. A61N 5/1031
2021/0128949 A1   5/2021 Caldara et al.
2021/0158955 A1*  5/2021 Azizian ................. G16H 40/63

OTHER PUBLICATIONS

Partial European Search Report for Application No. 22189029.6, mailed Jan. 20, 2023 (14 pages).
International Preliminary Report on Patentability for International Application No. PCT/EP2023/071830, mailed May 6, 2024 (19 pages, with Notification and annexes).
Written Opinion for International Application No. PCT/EP2023/071830, mailed Dec. 14, 2023 (14 pages).
International Search Report for International Application No. PCT/EP2023/071830, mailed Dec. 14, 2023 (5 pages).
Office Action in Chinese Patent Application No. CN202380057798.0 with English Translation, dated Sep. 27, 2025, (13 pages).

* cited by examiner

REMOTE CONTROL OF RADIATION THERAPY MEDICAL DEVICE

CROSS-REFERENCE TO RELATED APPLICATIONS

The present application is the U.S. National Stage entry of International Application No. PCT/EP2023/071830, filed Aug. 7, 2023, which claims priority under 35 U.S.C. § 119 to European Patent Application No. 22189029.6, filed Aug. 5, 2022, the contents of which are incorporated by reference herein in their entirety.

TECHNICAL FIELD

Various examples disclosed herein pertain to remote control of a radiation therapy medical device. A server can execute an application that enables displaying and adjusting of values of device parameters of the radiation therapy medical device.

BACKGROUND

A radiation therapy medical device (RTMD) can deliver radiation to a treatment site of a patient. Such irradiation is configured in accordance with values of multiple device parameters, to thereby, e.g., define the amount of radiation to be delivered, the treatment site, etc. A treatment plan specifying these values is typically determined in a planning phase prior to the irradiation phase itself. During the irradiation phase, the values of the device parameters are supervised.

Such tasks of generating and confirming the treatment planning, supervising the irradiation, etc. are conventionally performed by users that are physically present at the RTMD and by user interaction via a human machine interface (HMI) of the RTMD.

Techniques have been disclosed that enable remote control of the RTMD, see US 2007/0041496 A1. Such techniques face certain restrictions and drawbacks. For instance, distributed control by a user that is located at the RTMD and the further user that is located remotely may not be possible or may cause conflicts. Certain functionality in the control of the RTMD—e.g., supervision of the irradiation—may not be possible. Reliability may be compromised by the techniques disclosed in the prior art.

SUMMARY

Accordingly, a need exists for advanced techniques of remote control of an RTMD. A need exists for techniques that mitigate or overcome at least some of the above-identified restrictions and drawbacks.

This need is met by the features of the independent claims. The features of the dependent claims define embodiments.

Various examples of the disclosure generally pertain to a computer-implemented method. The computer-implemented method includes establishing a data connection with a radiation therapy medical device at a server. The data connection is via the Internet. The computer-implemented method further includes executing an application for remote configuration of multiple device parameters of the radiation therapy medical device at the server. The application provides a user interface for displaying and adjusting values of the multiple device parameters. The computer-implemented method further includes implementing a repetitive bi-directional synchronization of the values of the multiple device parameters while the application is being executed. The repetitive bi-directional synchronization is between the application and the radiation therapy medical device via the data connection.

A computing device, e.g., a server that may be located at a server farm, comprises at least one processor and a memory, the at least one processor being configured to load program code from the memory and execute the program code. Wherein the at least one processor, upon executing the program code, is configured to establish a data connection with a radiation therapy medical device. The data connection is via the Internet. The at least one processor is further configured to execute an application for remote configuration of multiple device parameters of the radiation therapy medical device at the server. The application provides a user interface for displaying and adjusting values of the multiple device parameters. The at least one processor is further configured to implement a repetitive bi-directional synchronization of the values of the multiple device parameters while the application is being executed. The repetitive bi-directional synchronization is between the application and the radiation therapy medical device via the data connection.

A system is provided that includes the computing device and the radiation therapy medical device.

A computer program or a computer-program product or a computer-readable storage medium including program code. When the program code causes at least one processor that executes the program code to establish a data connection with a radiation therapy medical device. The data connection is via the Internet. The program code further causes the at least one processor to execute an application for remote configuration of multiple device parameters of the radiation therapy medical device at the server. The application provides a user interface for displaying and adjusting values of the multiple device parameters. The program code further causes the at least one processor to implement a repetitive bi-directional synchronization of the values of the multiple device parameters while the application is being executed. The repetitive bi-directional synchronization is between the application and the radiation therapy medical device via the data connection.

It is to be understood that the features mentioned above and those yet to be explained below may be used not only in the respective combinations indicated, but also in other combinations or in isolation without departing from the scope of the invention. For instance, at least some steps of the computer-implemented method can be executed by the computing device, e.g., the server. Furthermore, it would be possible that the system including, both, the computing device or specifically the server, as well as the radiation therapy medical device can execute the computer-implemented method as disclosed herein.

DETAILED DESCRIPTION

Figure 1:
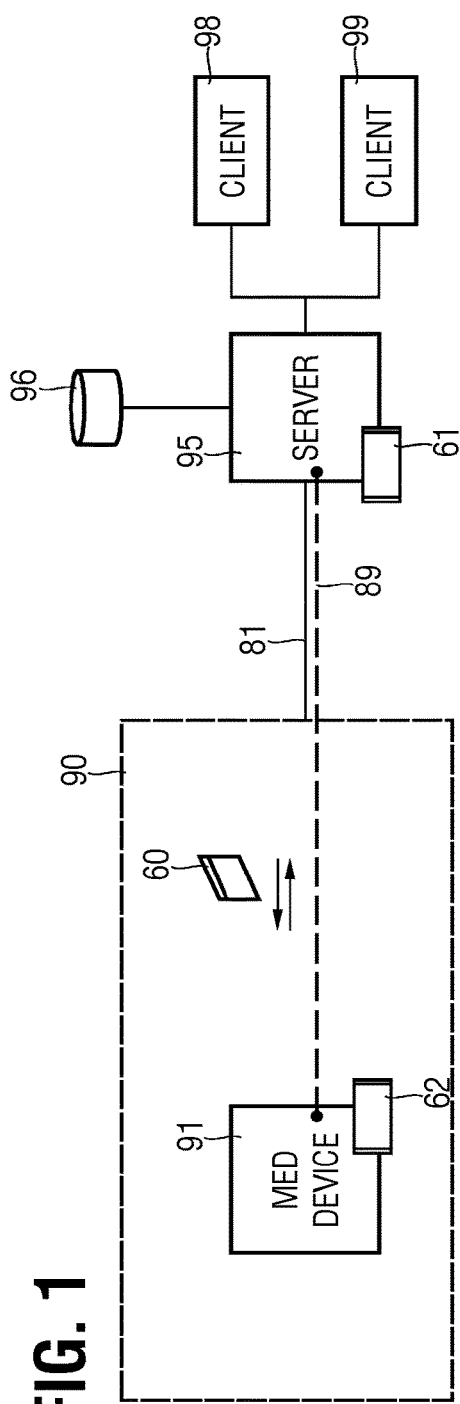
FIG. 1 schematically illustrates a system including a radiation therapy medical device and a server according to various examples.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various techniques disclosed herein pertain to radiation therapy, specifically to configuring a radiation therapy.

Radiation therapy can be used to treat cancer. For instance, photons, electrons, or heavy particles (e.g., protons or ions) can be employed for radiation therapy. An applicator can be used to deliver the radiation to the treatment site. Radiation can be generated using bremsstrahlung.

A radiation therapy event includes a planning phase and irradiation phase and optionally further phases. The various phases can be offset in time, e.g., executed at different days.

For instance, and inter-operative radiation therapy event may be controlled. Here, a tumor is removed in a surgical procedure. I.e., the radiation phase is coincident with a surgical procedure. The tissue surrounding the cavity resulting from the removal of the tumor can be subjected to radiation such as x-rays following the surgical procedure. Residual tumor cells are thereby incapacitated.

Next, various phases of a radiation therapy event are discussed. Firstly, during a treatment planning phase, a treatment plan is determined. This includes adjusting the values of multiple device parameters, e.g., to thereby set the treatment site, set the radiation dose, set the radiation intensity, set the path of the radiation through the surrounding tissue, etc. Then during the treatment phase (or irradiation phase), the predetermined treatment plan is executed. The values of the device parameters are typically monitored so as to avoid deviation from any predetermined setpoints in accordance with the treatment plan. Sometimes, there can be an intermediate pre-irradiation phase during which the treatment plan is approved for application. Sometimes, there can be a post-irradiation phase where a radiation report is determined and optionally shared.

During the various phases of the radiation therapy event, typically multiple users will interact to set-up the treatment plan, confirm the treatment plan, monitor the radiation, and/or determine the radiation report. For instance, a radiologist, an oncologist, a technician for operating the RTMD, etc. can take over certain tasks associated with the various phases of the radiation therapy.

Multiple control tasks occur during the various phases of the radiation therapy event.

According to various examples disclosed herein, it is possible to enable remote control of the radiation therapy device. I.e., all or at least some tasks of the control of the RTMD can be executed at a site that is remote from the site of the RTMD itself. Furthermore, according to various examples disclosed herein, distributed/shared control is possible. For instance, a first user can engage in control of the RTMD at the site of the RTMD using a user interface of the RTMD; and another second user can engage, e.g., contemporaneously and in collaboration with the first user, and the control of the RTMD at a remote site. Collaborative control is possible where multiple users at different sites collaborate to control the RTMD.

According to various examples, this is achieved by a server-hosted control application that provides a user interface (UI) for displaying and adjusting the values of the multiple device parameters of the RTMD. Then, the adjusted values can be provided to the RTMD.

The UI can be accessed by multiple clients. The UI can be implemented by a webpage.

According to various examples, techniques are presented which enable contemporaneous adjustment of the values of the device parameters by multiple users which may be at a remote site and/or locally at the RTMD. Specifically, techniques are disclosed that avoid conflicts in the adjustment of the values of the device parameters where multiple users engage in the control of the RTMD. For instance, if a first user adjusts the value of a given device parameter (e.g., through remote control) and approximately at the same time a second user—that may be located at another site then the first user, e.g., locally at the RTMD-adjusts the value of the same given device parameter, according to reference implementations—e.g., such as those described in US 2007/0041496 A1—false settings or unintended configurations may result.

According to various examples, such drawbacks are mitigated by maintaining, at the server, a digital twin of the RTMD. The digital twin can store up-to-date values of the device parameters of the RTMD and may be synchronized—e.g., substantially in real time—with a control module, typically an embedded software control module, at the RTMD that is responsible for maintaining and applying respective associated values of the multiple device parameters. Thereby, in a situation in which a value of a device parameter is updated at the digital twin, this adjusted value of the device parameter is propagated to the control module at the RTMD automatically and at low latency, e.g., substantially in real time. Likewise, any adjusted value of a device parameter that results from user interaction via a UI of the RTMD is propagated automatically and at the low latency to the digital twin. The digital twin thereby remain synchronized with the RTMD.

Additionally, it is possible to perform conflict resolution that defines certain conflict resolution rules in case the value of one and the same given device parameter is contemporaneously updated at, both, the digital twin, as well as the RTMD. The conflict resolution algorithm may reside at the RTMD, e.g., at a respective control application at the RTMD.

According to various examples, to facilitate the digital twin at the server, it is possible that a data connection is established between the server and the RTMD. Specifically, it would be possible that the data connection is via the Internet or, generally, a wide-area network. The data connection can be implemented, e.g., on Application Layer of an Open System Interface (OSI) protocol stack. The data connection can thereby enable an application for remote configuration that is executed at the server to send or receive data to a counterpart application at the RTMD. The data connection can also be implemented on a lower layer of the OSI protocol stack. For instance, the data connection could be implemented on Layer 2 or Layer 3. IP-in-IP-tunneling would be possible. Here, data packets exchanged along the data connection can be encrypted in Layer 3 of the OSI protocol stack and then addressed to a destination that is defined in accordance with an endpoint associated with the data connection.

It is then possible to implement a repetitive bi-directional synchronization of the values of the multiple device parameters between the application executed at the server and the RTMD via the data connection.

FIG. 1 schematically illustrates a system 71 according to various examples. The system 71 includes an RTMD 91. For instance, the RTMD 91 may be located in the hospital 90, e.g., defined by a local area network (LAN) being connected to the Internet 81.

The system 71 also includes a server 95. The server 95 can be located in the cloud, i.e., remotely from the hospital 90 and the RTMD 91. The server 95 and the RTMD 91 can be connected via the Internet 81.

The server 95 executes an application 61 for remote configuration of multiple device parameters of the RTMD 91. The application 61 can provide a UI to users, the UI being for displaying and enabling adjustment of values of the multiple device parameters. The application 61 can implement a digital twin of the RTMD 91.

While in the scenario of FIG. 1, the server 95 is only connected to a single RTMD 91, as a general rule, the server 95 may be connected with multiple RTMDs. The server 95 may host multiple instances of the application 61, one for each RTMD. Thereby, multiple digital twins of multiple RTMDs can be implemented at the server 95. For instance, it would be possible, that each instance of the application 61 is instantiated at a virtual machine setup by the server 95. Alternatively, it would also be possible that each instance of the application 61 is instantiated in a respective container instantiated at a single virtual machine at the server 95.

As illustrated in FIG. 1, multiple user clients 98, 99 can access the application 61 executed at the server 95. For instance, the application 61 may implement hosting of a webpage that can be accessed by the clients 98, 99 through a browser executed at the clients 98, 99. It would also be possible that the clients 98, 99 implement applications that acts as a respective data interface provided by the application 61.

The server 95 can access a database/data repository 96. Various data can be stored in the data repository 96. For instance, patient information of patients to be treated by the RTMD 91 may be stored in the data repository 96. Alternatively or additionally, user information of users engaging in the control of the RTMD 91 may be stored in the repository, e.g., contact details of parties associated with a radiation therapy event.

The UI of the application 61 may be accessed via the clients 98, 99. For instance, the UI may provide a webpage via which current values of the device parameters can be displayed in which also provides for the possibility of adjusting the values of one or more of such device parameters. The webpage can be hosted by the application 61 executed at the server 95 and can be loaded by the clients 98, 99.

For instance, a further application 62 may be executed at the RTMD 91. Such application 62 may also provide for a UI for displaying and adjusting values of the multiple device parameters, e.g., using a human machine interface (HMI) provided locally at the RTMD 91. The application 62 may also interface and embedded software control module of the RTMD 91 (not shown in FIG. 1). The embedded software control module may control a radiation applicator of the RTMD 91. The application 62 may set, at a respective memory access by the embedded software control module 161, values of device parameters for control at the radiation applicator. This corresponds to a hierarchy in the control. On application level, the application 62 adjusts values of the device parameters; and then the suggested values are propagated to the hardware-adjacent embedded software control module 161.

The application 62 may also implement a conflict resolution functionality. For instance, if the value of a given device parameter is requested to be updated by a respective adjustment input through the application 61 of the server 95, and—at the same time or substantially contemporaneously—the same given device parameter is updated to another value through the HMI provided at RTMD 91, the conflict resolution functionality of the application 62 may determine, based on one or more criteria, how to resolve the conflict. Such criteria can include, but are not limited to: user rights of the different users associated with the adjustments of the value of the given direct device parameter; a priority associated with local adjustment versus remote adjustment; timestamps associated with respective user requests to adjust the value of the given device parameter; etc. For instance, the user rights may be predetermined and may specify a higher priority for the user remotely adjusting the value of the given device parameter than for the user locally adjusting that value of the given device parameter. In this case, the adjustment made by the user through the server 95 may prevail over the adjustment made by the user locally via the HMI of the RTMD 91. For instance, it would be possible that local adjustments are always favored over remote adjustments of values of the device parameters, based on a respective predetermined priority associated with the local adjustment was to remote adjustment. In yet a further example, it would be possible that even small differences in the timing associated with respective adjustments is considered; for instance, it would be possible that the most recent adjustment prevails over any earlier adjustments. Upon resolving a conflict, the respective adjusted value may be propagated to the embedded software control module 161. Upon resolving a conflict, a respective warning message may be output, e.g., via the HMI of the RTMD 91 and/or via the UI provided by the application 61 at the server 95.

Also illustrated in FIG. 1 is a data connection 189 between the server 95 and the RTMD 91. The data connection 189 is via the Internet 81. The data connection 189 can be used to communicate data between the RTMD 91 and the server 95. For instance, a repetitive bi-directional synchronization of values of multiple device parameters of the RTMD 91 may be implemented between the application 61 and the RTMD 91 via the data connection 89. The applications 61, 62 can communicate with each other, e.g., to implement the repetitive bi-directional synchronization of the values.

Figure 2:
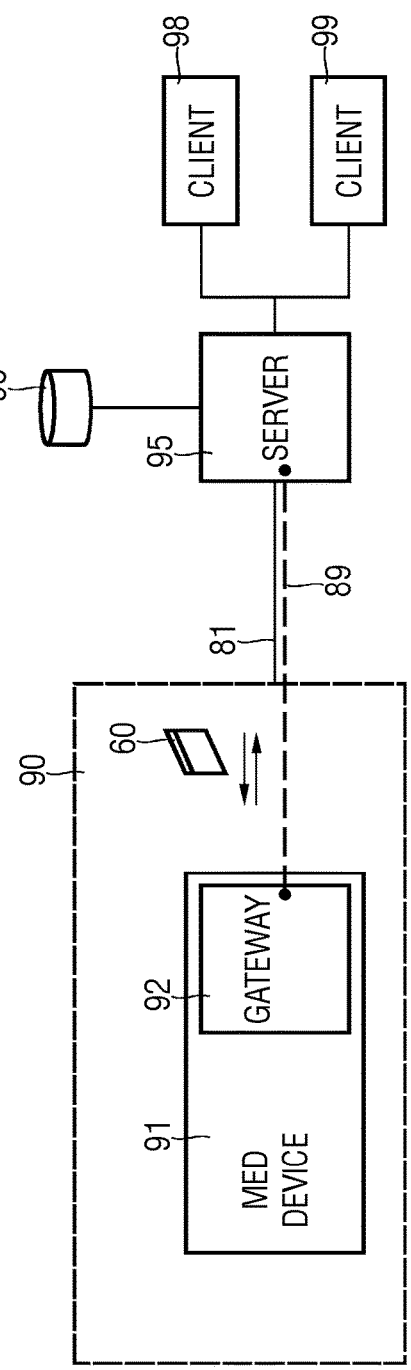
FIG. 2 schematically illustrates the system including a radiation therapy medical device and a server according to various examples.

FIG. 2 illustrates the system 71 in another implementation. FIG. 2 illustrates a scenario in which the RTMD 91 includes a gateway module 92. The gateway module 92 can implement connectivity functionality. For instance, data traffic from and to the Internet 81 can be routed to via the gateway module 92. The gateway module 92 may implement encryption functionality. The gateway module 92 may serve as an endpoint of the data connection 89. For instance, establishing of the data connection 89 at the server 95 may include transmitting, to the gateway module 92, a connection establishment request message. This establishment request message can be associated with access credentials of the cloud server 95. Thereby, establishment of the data connection 89 can be restricted, at the RTMD 91, to trusted counterpart servers 95.

In the scenario FIG. 2, the gateway module 92 is illustrated to be part of the RTMD 91. In some examples, it would also be possible that the gateway module 92 is arranged separately, within the local area network of the hospital 90, from the RTMD 91. The RTMD 91 and the gateway module 92 can then communicate via the LAN of the hospital 90.

Figure 3:
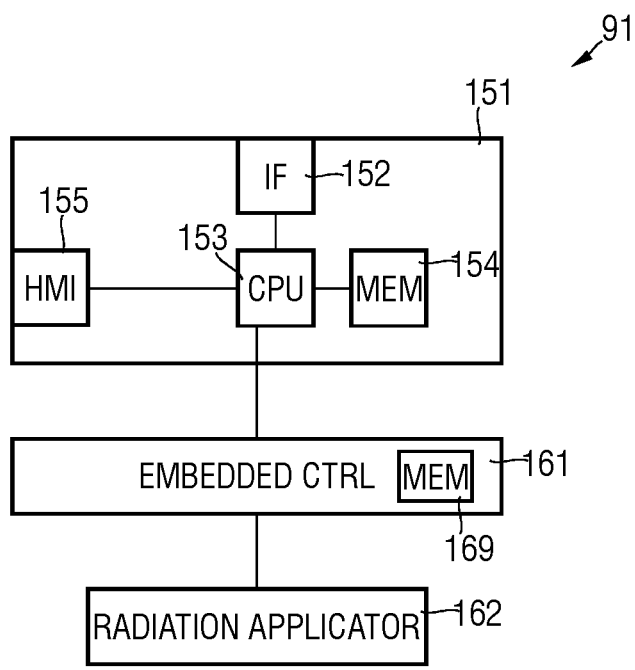
FIG. 3 schematically illustrates a radiation therapy medical device according to various examples.

FIG. 3 schematically illustrates the RTMD 91. The RTMD 91 includes a processing circuitry 151 that includes a processor 153, a non-volatile memory 154, a communication interface 152, as well as a human machine interface 155. For instance, the HMI 155 can include a monitor, a keyboard, a mouse, etc. Voice control would be possible. The processing circuitry 151 implements application-level functionality for the control of the RTMD 91.

The processor 153 can execute the application 62. The application 62 may have multiple tasks such as displaying and adjusting values of device parameters of the RTMD 91, performing an integrity check of the values of the device parameters, participating in a repetitive bidirectional synchronization of values of the multiple device parameters with the application 61 executed at the server 95, interfacing with an embedded software control module 161, conflict resolution, etc.

It would also be possible that the processor 153 executes an application implementing the gateway module 92 (cf. FIG. 2), to thereby communicate data via the communication interface 152. The gateway module 92 may also be implemented by the application 62. The gateway module 92 may also be arranged separately from the RTMD 91.

The processor 153 can also communicate with an embedded software control module 161. For instance, the embedded software control module 161 can be implemented on a microcontroller, a Field Programmable deprecated Array (FPGA), or an Application Specific Integrated Circuit (ASIC). The embedded software control module 161 can control the radiation applicator 162 by respective control commands, typically, voltages and currents output via a digital-to-analog converter of the respective underlying hardware. The embedded software control module 161 implements hardware-adjacent functionality.

For this purpose, the embedded software control module 161 can execute a control software, e.g., based on program code that is stored in an internal memory 169 of the embedded software control module 161. The control software can also access values of the device parameters that are stored in the memory 169. For instance, a treatment plan that is generated based on user interaction via the HMI 155 and then stored in the memory 154 may at some point be propagated down to the embedded software control module 161 and respective values may be updated in the memory 169. A hardware-adjacent integrity check of the values proposed by the treatment plan with hardcoded threshold settings that are stored in the memory 169 may be executed at this time.

Figure 4:
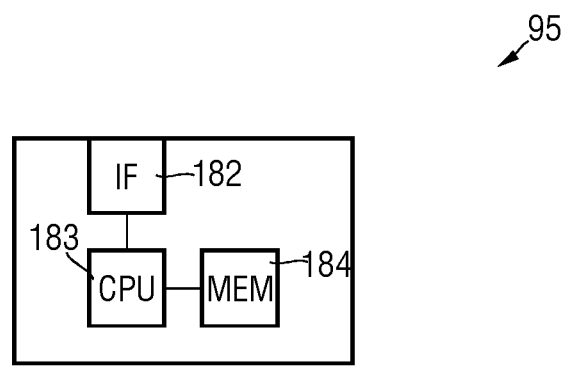
FIG. 4 schematically illustrates a server according to various examples.

FIG. 4 schematically illustrates the server 95. The server 95 includes a processor 183, a non-volatile memory 184, and a communication interface 182. The processor 183 can load and execute program code from the memory 184. Upon executing the program code, the processor 183 can execute the application 61, to thereby provide a UI for displaying and adjusting values of multiple device parameters of the RTMD 91. The UI can be accessed via the communication interface 182, e.g., by the clients 98, 99. The processor 183 may also access the data repository 96. Alternatively or additionally, a local data repository may be stored in the memory 184. The application 61 may be executed by a virtual machine or container that is set up at the server 95. Multiple instances of the application 61 may be executed; the multiple instances being associated with different RTMDs.

Figure 5:
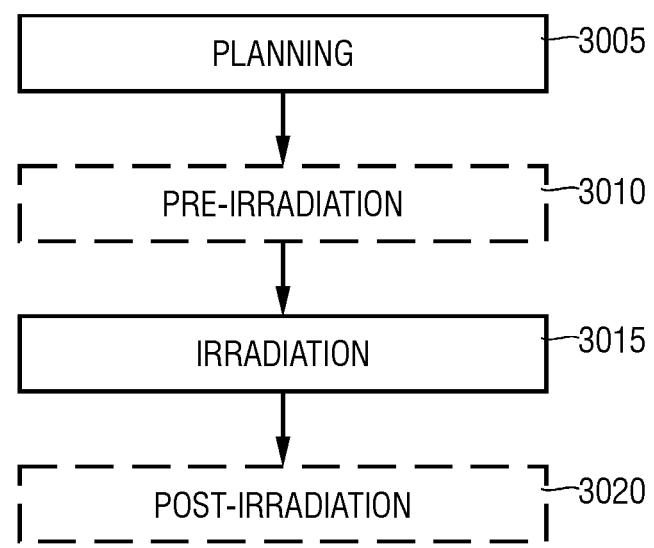
FIG. 5 is a flowchart of a method according to various examples.

FIG. 5 is a flowchart illustrating aspects of a radiation therapy event. The radiation therapy event can be implemented by the RTMD 91. The radiation therapy event includes multiple phases that are illustrated in FIG. 5. It is not necessary that the radiation therapy includes all of these boxes. Sometimes, e.g., the pre-radiation phase at box 3010 may be optional; sometimes, the post-irradiation phase at box 3020 may be optional.

Initially, a planning phase is executed at box 3005. During the planning phase, a radiation therapy plan is set up for the radiation therapy event. This means that certain values of device parameters are adjusted in accordance with patient-specific characteristics.

For instance, a patient profile may be loaded at the beginning of the planning phase at box 3005, e.g., from the data repository 96. The patient profile can specify, e.g., patient demographics such as age, gender, etc. The patient profile can include a patient unique identifier. The patient profile can specify a treatment site. The patient profile can specify a history of previous radiation therapies executed for that patient.

Based on the patient profile, one or more users can then adjust values of multiple device parameters, associated with the treatment plan. Examples would include acceleration voltage for x-ray radiation, radiation duration, applicator shape (defining a spatial shape of the radiation), etc. The treatment plan can include such a set of values for the device parameters. Since the setup of the treatment plan during the planning phase at box 3005 can occur significant time prior to the actual radiation, typically such set of values of the device parameters included in the treatment plan is not directly propagated to a hardware-adjacent control module such as the embedded software control module 161 discussed in connection with FIG. 3. Typically, this occurs prior to the radiation, e.g., in the pre-irradiation phase at box 3010 that is explained next.

The pre-irradiation phase commences at box 3010. Here, the patient may be placed at the application position next to the RTMD. The predetermined treatment plan obtained from the planning phase at box 3005 can be cross-checked and confirmed by medical personnel.

It would be possible that values of the device parameters as indicated by the treatment plan are propagated to a control software executed by the embedded software control module 161. A respective internal memory 169 can be updated. This may be triggered by approval confirmation of the treatment plan by one or more users.

Approval may be provided directly at the RTMD, e.g., via a user interface of the RTMD. Approval may also be provided remotely, i.e., via the server 95.

Once the radiation plan has been cleared/approved, the method can commence at box 3015 and the irradiation is executed. While executing the irradiation during the irradiation phase at box 3015, it is possible to monitor the up-to-date values of the device parameters, to ensure compliance with the treatment plan. Any deviations can thereby be detected immediately, and the radiation may then be aborted.

Next, during the post-irradiation phase at box 3020, the radiation therapy can be summarized in a medical report. For instance, the aggregated dose applied, posttreatment observations, etc. can be summarized in the medical report. The medical report can be published to a respective repository.

According to the techniques disclosed herein, remote control of the RTMD is possible in any one of boxes 3005, 3010, 3015, and 3020. This means that certain actions associated with the phases can be completed by users remotely located away from the RTMD. Sometimes only in one or some of those phases remote control may be enabled; sometimes, all boxes may employ remote control. The application 61 at the server 95 may be executed through one or more of the phases disclosed in connection with FIG. 5.

Figure 6:
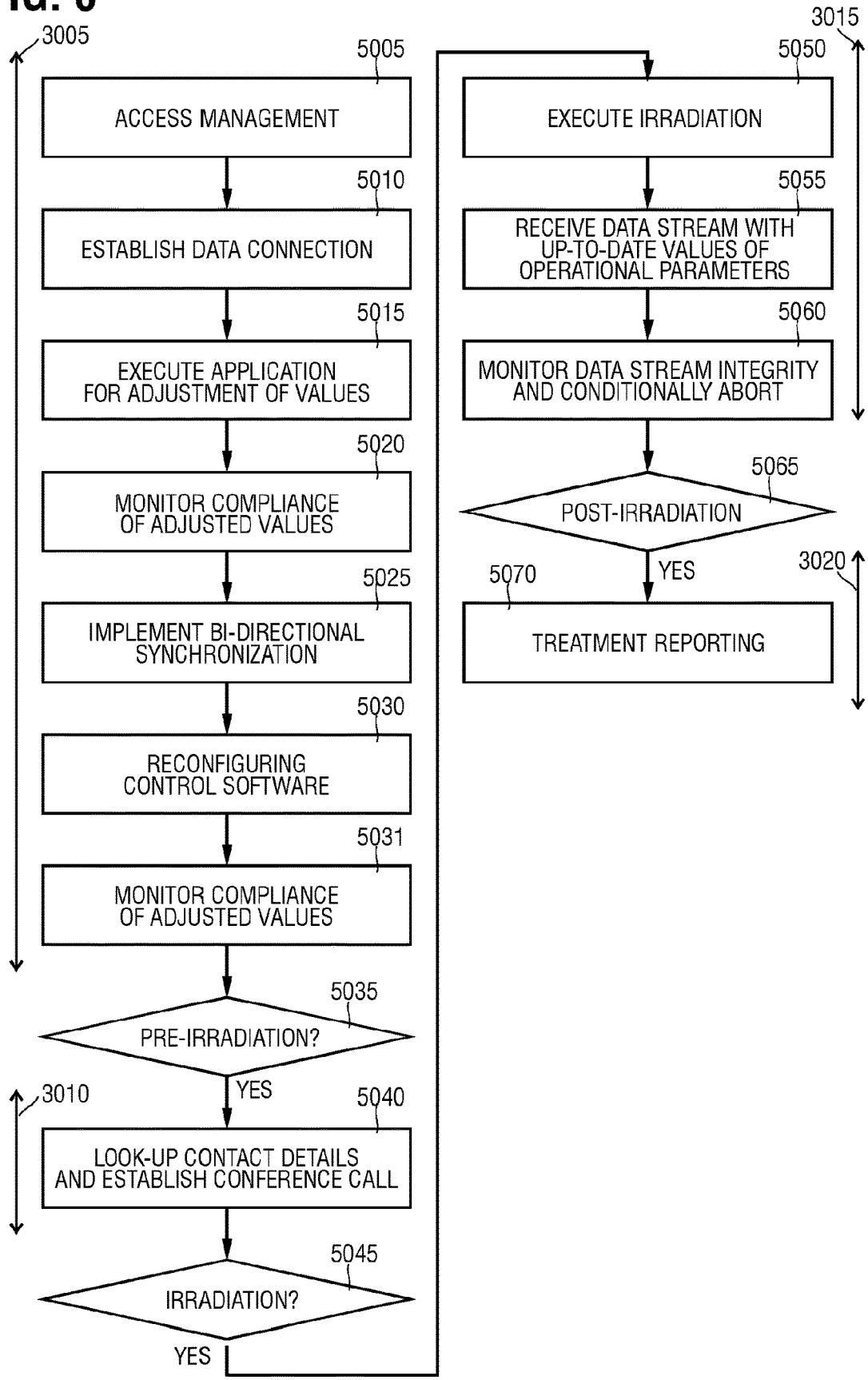
FIG. 6 is a flowchart of a method according to various examples.

FIG. 6 is a flowchart of a method according to various examples. The method of FIG. 6 is for remote controlling a RTMD such as the RTMD 91 discussed above. Some boxes of the method of FIG. 6 may be executed by a server, while some of the boxes of the method of FIG. 6 may be executed locally at a processor or other processing hardware of the RTMD. Respective aspects of distributed processing have been discussed above in connection with FIG. 1 and FIG. 2.

The order or sequence of the boxes can be varied, depending on the implementation. Not all boxes need to be executed in all scenarios; the various boxes can be optional.

At box 5005, it is optionally possible to perform access management. In some scenarios, access management at box 5005 may be executed only after establishing the data connection at box 5010 or may be executed while establishing the data connection at box 5010. As such, box 5010 may sometimes be executed prior to executing box 5005.

Access management can be performed on server level and/or user/client level. Both scenarios are explained below.

For instance, it would be possible that a connection establishment request message is transmitted from the cloud server 95 to the RTMD 91. This connection establishment request message can trigger establishment of the data connection 89. The connection establishment request message can be associated with access credentials of the cloud server 95. Then, it would be possible to check these access credentials at the RTMD, e.g., by forming a lookup in a respective database/repository. Thereby, only authorized servers may be allowed to establish the data connection 89.

It is not required in all scenarios that access credentials of the server 95 are checked at the RTMD 91. For instance, in some scenarios the access credentials of the server 95 may be checked at another server (not shown in FIG. one or FIG. 2) serving as a central authority.

In some scenarios, it would be possible to provide, from the RTMD to the server 95, one or more user identities of users that are authorized to access the application 61. Then, the server 95 can check access rights of users accessing the user interface provided by the application 61 based on such one or more identities. Users may be required to enter their credentials (e.g., password, 2-factor authentication, certificate-based authentication, to give just a few examples) into the UI when connecting to the server 95 using a client 98, 99. Thereby, only authorized users may be allowed to engage in remote control of the RTMD 91. It would also be possible that only certain clients, i.e., on hardware level, are allowed to access the UI provided by the application 61 executed by the server 95.

Also in such a scenario, it would be possible that the one or more user identities of users and/or clients that are authorized to access the application 61 are not provided from the RTMD 91 to the server 95, but rather provided from another server functioning as a central authority to the server 95. It would also be possible that such user identities are stored in the data repository 96.

At box 5010, the data connection 89 is established. This can include, e.g., setting up a VPN tunnel. Alternatively or additionally, this can include setting up an Application-Layer communication protocol between the application 61 executed at the server 95 and the application 62 executed at the RTMD 91. Alternatively or additionally, this can include setting up encryption along a data tunnel.

The server 95 and the RTMD 91 both engage in the establishment of the data connection 89.

The establishment of the data connection 89 facilitate low-latency communication between the server 95 and the RTMD 91. Furthermore, status pings can be repetitively communicated along the data connection 89; thereby ensuring that the digital twin implemented at the server 95 remains up-to-date with respect to the RTMD 91. The integrity of the data connection 89 can be monitored so as to avoid any loss of synchronization between the digital twin that the server 95 and the RTMD 91 due to inhibited or failed functionality of the data connection 89.

Next, at box 5015, the application can be executed for adjustment of values of one or more device parameters of the RTMD 91.

Sometimes, the application may be first executed at box 5015; and only then the data connection may be established at box 5010. As such, box 5015 may sometimes be executed prior to executing box 5010.

Some example device parameters that may be enabled for remote configuration using the application 61 are disclosed below in TAB. 1.

TABLE 1

Examples of device parameters that be remote configured
by the techniques disclosed herein.

| DEVICE PARAMETER | EXAMPLE DETAILS |
|---|---|
| Radiation intensity | The amount of radiation per time may be adjusted. For instance, the radiation intensity may be adjusted by setting a current of particles that are accelerated onto a target generate the radiation, e.g., by setting the current of an electron flow accelerated onto a target to generate x-rays. The radiation intensity can specify an irradiation depth, e.g., defining how the penetration depth of radiation into the tissue. |
| Beam shape | The beam shape of the radiation may be adjusted, e.g., by selecting an appropriate beam stop or an appropriate applicator. |
| Radiation duration | The duration of the irradiation during which the patient is exposed to the radiation may be adjusted. The duration of the radiation will affect the aggregated dose. |
| Radiation dose | The aggregated radiation dose may be specified by the radiation intensity and the radiation duration. |
| Beam direction | Sometimes, the RTMD may offer the option for adjusting the direction with which the radiation beam impinges on the radiation target. This beam direction may be adjusted. The radiation shape may be a function of the beam direction. |
| Rastering mode | Sometimes, the RTMD may offer the option for a raster scan of the radiation beam. The beam direction and/or the radiation shape may be a function of the rest position. |
| Acceleration voltage | Sometimes, radiation - e.g., x-rays - may be generated from accelerating electrons or other charge particles onto the target. This acceleration voltage may be adjusted. Acceleration voltage impacts the radiation intensity or the energy of the radiation particles. |
| Threshold settings | The device parameters can include settings for one or more further device parameters, e.g., those disclosed above. Thereby, constraints can be imposed on device parameters that directly affect the irradiation by such "meta" device parameters. |
| Process identifier | Each radiation therapy event may be unambiguously associated with a unique process identifier. This process identifier may ensure that all engaged parties work on the same radiation therapy event. |
| Progress indication | As discussed above in connection with FIG. 5, a radiation therapy event can include multiple phases. It is possible that the current phase of the radiation therapy event - e.g., indicated by the process identifier, as discussed above - is indicated by such progress identifier. |
| Approval scheme | In some scenarios, before irradiation based on a treatment plan can be executed, approval of multiple parties may be required. Typically, such approval is obtained in a pre-irradiation phase. Details with respect to these approvals scheme can be determined as a device parameter. For instance, it may be specified which particular parties are required to approve a treatment plan for a given irradiation event. For instance, respective identities of the parties, e.g., of a technician or a radio-oncologist, may be specified. |

In some scenarios, it would be possible that the UI provided by the application that is executed at box 5015 depends on the phase of the radiation therapy event. In other words, the UI may be reconfigured in accordance with the value of the therapy progress indication, as explained in TAB. 1, as the radiation event progresses through, e.g., the phases according to FIG. 5. Different functions can be provided depending on the phase. For instance, it would be conceivable that during the planning phase (cf. FIG. 5: box 3005), an adjustment of various values of the device parameters is possible; on the other hand, during the pre-irradiation phase (cf. FIG. 5: box 3010), such an adjustment of the values may not be possible anymore. During the pre-irradiation phase, it may only be possible to clear for application a certain predetermined treatment plan including a respective set of values for the device parameters; or revert back to the planning phase. During the irradiation phase, an up-to-date display of the values of the device parameters as currently applied by the RTMD 91 may be provided; a manual adjustment may not be possible. On the other hand, the irradiation may be altogether aborted via the UI. The particular phase of the radiation therapy event may be synchronized between the server 95 and the RTMD 91 by repetitively communicating the respective value of the progress indication (cf. TAB. 1) on the data connection 89.

At box 5020 it is optionally possible to monitor compliance of adjusted values with one or more threshold settings. For instance, one or more threshold comparisons can be executed to, e.g., compare the acceleration voltage with a respective threshold and/or compare the acceleration current with one or more respective threshold settings, etc. It would be possible that such monitoring of the values for compliance is executed at the server 95 by means of the application 61 and/or is executed at the RTMD 91 by means of the application 62.

The one or more threshold settings can be parameters that are themselves adjusted via the application 61 at box 5015 (cf. TAB. 1: "Threshold settings"). By enabling adjustment of the threshold settings through the remote control using the UI provided by the application 61, enhanced configurations become possible. At the same time, because later on a hardware-adjacent integrity check of the values can be implemented, e.g., by means of the embedded software control module 161, safety of the radiation is not compromised.

At box 5025, a repetitive bi-directional synchronization of the values of the multiple device parameters is implemented. The synchronization is between the application 61 executed at the server 95 and the RTMD 91. The synchronization is via the data connection 89 established at box 5010. For instance, the application 61 can communicate with the application 62.

The repetitive bidirectional synchronization may be based on push notifications that are transmitted via the data connection 89.

In a first example, it would be possible that once an adjustment of the value of a given device parameters detected at the application 61, the application 61 provide such push notification to the application 62. Likewise, it would be possible that once an adjustment of the value of a given device parameters detected at the application 62, the application 62 provide such push notification to the application 61. I.e., uplink and downlink push notifications are possible. Thus, on-demand repetitive bi-directional synchronization of the values of the medical device parameters is facilitated.

In a second example, it would be possible to monitor, at the RTMD 91 for changes of the values of the multiple device parameters in a control software that is executed by the embedded software control module 161. Then, responsive to detecting a change of a given value of any one of the multiple device parameters, a push notification of that change may be provided to the server 95, more specifically, to the application 61 executed by the server 95. This ensures that the digital twin at the server 95 includes up-to-date values with respect to the hardware-adjacent control.

It would also be possible that any adjustment of a value of a device for me to that is input via the HMI 155 at the RTMD 91 triggers such push notification to the server 95.

As part of box 5025, it would also be possible to perform conflict resolution. For instance, a first change of a given value of a given device parameter may be triggered through the application 61 at the server 95; and a second change of the same given value of the given device parameter may be triggered through the application 62 at the RTMD 91. In such a scenario, it would be possible to perform a conflict resolution with respect to both changes. One or more conflict resolution rules may be applied, e.g., user rights associated with the different uses associated with the first and second change; a predetermined priority with respect to a local adjustment of values of the multiple device parameters versus remote adjustment of the values of the multiple device parameters; or timestamps associated with the changes.

Conflict resolution is not required in all scenarios. For instance, it would be possible that a check-in/check-out procedure is used for different users that operate on different client devices or locally at the RTMD may, prior to changing any values of device parameter, check into a respective change mode. Such check-in is only enabled if no other users contemporaneously checked in. In such a scenario it is ensured that only one user at a time can change values of a device parameter. A respective check in/check out parameter may also be synchronized between the RTMD 90 and the server 95, i.e., the respective applications.

At box 5030, it would be possible to obtain, from the server 95, a downlink notification of a change of a given value of a given device parameter. This downlink notification may be, initially, obtained at the application 62. The intended change of the value of the given device parameter may then be treated in different ways, depending on the implementation.

In some scenarios, it would be possible that the new value of the given device parameter is written into the treatment plan by the application 62. For instance, the treatment plan may be stored in the memory 154. The treatment plan may be stored for later use, e.g., during the pre-irradiation phase 3010 or even the irradiation phase 3015.

In some scenarios, it would also be possible that the new value of the given device parameters is directly propagated to lower layers of the control stack of the RTMD 91. For instance, it would be possible that responsive to obtaining the notification of the change of the given value, a request for reconfiguring the given value in a control software that is executed by the embedded software control module 161 (cf. FIG. 3) is provided to the embedded software control module 161, e.g., by the application 62. In any case, once a value is adjusted at the embedded software control module 161, the embedded software control module 161 can implement a further check on the integrity of the respective given value, box 3031. For example, the embedded software control module 161 may monitor that the given values complied with one or more hardcoded threshold settings in a memory of the embedded software control module 161. This can pertain to a hardware-adjacent integrity check of the adjusted values of the device parameters. For instance, the radiation applicator 162 may read such values maintained by the control software that is executed by the embedded software control module 161. Such hardware-adjacent integrity check may complement an application-level integrity check of the values of the device parameters executed at box 5020. The safety level can be increased; operating errors can be avoided.

Where the term values maintained by the control software are not immediately updated at box 5030 (but rather the treatment plan is stored at a high layer for later use), it would be possible that the values maintained by the control software are later updated based on the treatment plan. e.g., in the pre-irradiation phase (cf. FIG. 5: box 3010). I.e., box 5031 may be executed after box 5035 or even after box 5045.

Aspects disclosed in connection with boxes 5005 through 5030 pertain to the planning phase (cf. FIG. 5: box 3005). The method then commences with box 5035.

At box 5035, it is checked whether the pre-irradiation phase is to commence (cf. FIG. 5: box 3010). The pre-irradiation phase is generally optional.

For instance, the pre-irradiation phase may in some scenarios only be triggered by a user operating the RTMD 91, e.g., by a respective control command input via the HMI 155 (i.e., remote control not possible). This can ensure that the patient is properly placed so that the variation can commence. This increases safety.

The pre-irradiation phase can be indicated by a respective therapy progress indication, cf. TAB. 1. By means of the therapy progress indication, the server 95 may be informed of the pre-irradiation phase having been initiated (e.g., by a local user). The UI provided by the server 95 may then be re-configured, e.g., to show different buttons and/or HMI elements. This is because during the pre-irradiation phase typically different control tests are required and during the planning phase. For instance, during the pre-irradiation phase a review of a treatment plan may be required and approval of the treatment plan may be possible; while during the planning phase a set-up of a treatment plan e.g. from a template or from scratch may be required In some scenarios, approval of the treatment may be required within a certain predetermined time duration. In other words, upon triggering of the pre-irradiation phase at box 5035, a timer may be initialized and it may be monitored whether the timer expires before consent of all parties has been acquired. This ensures that a "four-eyes" approval scheme is implemented where multiple involved parties collaborate contemporaneously to approve a treatment plan. A normalized time for parties located in different time zones may be considered.

For instance, at box 5040, responsive to the value of the therapy progress indication equaling the pre-irradiation phase, the server 95 may perform a lookup, in the data repository 96, of contact details of multiple parties that are associated with the radiation therapy event. For instance, the contact details may be determined based on a another device parameter, i.e., the approval scheme (cf. TAB. 1). The approval scheme may determine a set of predetermined users that are required to approve the treatment plan prior to proceeding to the irradiation phase. The users may be defined by their role (e.g. "radio-oncologist") or by their unique identity (e.g., "Dr. John Doe"). The approval scheme may be fixedly set or may be pre-determined during the planning phase, as a device parameter synchronized between the RTMD 91 and the server 95.

It would then be possible to establish a conference call based on the contact details. Such contact details may, e.g., include a routing address of a conference call application that is executed on mobile devices of the multiple parties. I.e., a group called can be automatically triggered. Such auto-triggering of a conference call has the benefit of automatically involving all required parties necessary to clear a treatment plan. e.g., a radiologist and an oncologist, as well as a device technician. By auto-connecting these users, the time required to radiation may be reduced. It can be ensured that the right users are involved; e.g., different patients or radiation therapy events may be associated with different users.

Consent of all such parties that are included in the conference call may be required to proceed, at the check of box 5045, to the irradiation phase (cf. FIG. 5: box 3015).

There are various options available for singling such approval of the treatment plan. For instance, the approval may be input via the UI implemented by the application 61 and/or the HMI of the RTMD 91. Alternatively or additionally, it may be possible to input the approval via a user interface element provided by the conference call application that is executed on mobile devices of the multiple parties. For instance, the conference call application may communicate with the application 61 executed at the server 95 to thereby signal the approval. For instance, the conference call application may query, using a respective button interface element, approval of a user that is participating in the conference call.

The approval may require entering of user credentials and/or providing of a signature, e.g., a digital signature.

Such techniques help to implement a "four-eyes" approval scheme for the irradiation phase. The "four-eyes" approval scheme can be ensured even where, e.g., the radio-oncologist is not physically present at the site of the RTMD 81.

At box 5050, the irradiation of the patient is executed. This can include sending a respective trigger command from the software 62 executed by the processor 153 to the embedded software control module 161. The trigger command may only be sent in case the respective treatment plan has been previously approved by all parties that are associated with the respective treatment events, e.g., by means of a respective conference call at box 5040.

Then, the embedded software control module 161 controls the radiation applicator 162 based on values of the device parameters that are stored in the local memory 169 (and that are previously set based on the UI provided by the application 61 and the UI provided by the application 62; also cf. box 5031).

The embedded software control module 161 can repetitively and continuously report the values of the device parameters applied by the radiation applicator 162. For instance, control values and/or measured values/observed values can be reported, e.g., to the application 62.

It would be possible that such values are then provided to the server 95, e.g., to the application 61. This can facilitate supervising the radiation phase remotely. For instance, these values may be output via the UI provided by the application 61. Specifically, the UI provided by the application 61 may be reconfigured when executing the irradiation phase upon box 5045. The UI may be provided so as to enable supervision of the up-to-date values of the device parameters during the irradiation. For instance, the UI may depict a current value of a given device parameter, e.g., acceleration voltage; and may further depict, in an associated manner, the setpoint value of that given device parameter in accordance with the treatment plan. Thereby, any deviations can be immediately spotted. The UI may also display a user interface element that enables to abort the irradiation.

In such a state of an ongoing irradiation, low-latency supervision of the values of the device parameters can be desired. Where the supervision is remotely implemented, techniques to detect an interrupted data connection 89 may be employed, to avoid loss of real-time supervision capability.

For instance, it would be possible to switch from a packet-based communication (that may be used to communicate updated values of device parameters during the pre-irradiation phase and/or the planning phase, cf. box 5025) to a stream-based communication. Here, data resources are pre-allocated for multiple data frames of the respective data stream. Such switch from a packet-based communication to a stream-based communication is, however, optional.

It would be possible to provide, to the server 95, a data stream that includes a sequence of data frames and each data frame can include up-to-date values of the one or more operational parameters of the radiation RTMD during the irradiation phase.

In this regard, it would be possible to monitor, at the server 95 the integrity of the data stream during the irradiation phase. Each data frame may be associated with an expected transmission timing. Missing data frames can be immediately detected by the server by comparing whether, for a given transmission timing, the respective data frame of the sequence has been correctly received. Also, out-of-sequence arrival of data frames may be an indication of loss of integrity of the data stream.

Responsive to detecting that the integrity of the data stream is compromised, it would be possible to transmit, to the RTMD, an abort command to abort the irradiation phase. Thus, an automated abort of the irradiation can be facilitated (even if de facto the values of the device parameters used or observed during the irradiation are compliant with the treatment plan-however without the possibility of enabling real-time supervision at the server 95) in case the data connection offers compromised quality only. For instance, it would be possible that the data stream is implemented on the data connection and the abort command is transmitted using an alternative data connection. An alternative communication channel may be used, e.g., via another access technology or using alternative routing through the Internet. Thereby, even in scenarios where the data connection is compromised, the abort command may be successfully delivered to the RTMD 91.

Alternatively or additionally to using such an abort command, it would also be possible to implement a positive and/or negative acknowledgment protocol. Here, the server may positively acknowledge each data frame or each set of data frames. This positive acknowledgment may be transmitted via the data connection, as well. The acknowledgment of the data frames may be monitored at the RTMD 91, e.g., by the application 62 or by the gateway module 92. Based on said monitoring, the irradiation phase may be selectively aborted. For instance, where a negative acknowledgment is received, the irradiation phase can be aborted. Alternatively or additionally, in case within a certain tolerance time span upon transmitting a given data frame a respective positive acknowledgment for the data frame is not received, the irradiation phase can be aborted.

At box 5065, it is then checked whether the irradiation phase has completed and whether a post-irradiation phase is to commence (cf. FIG. 5: box 3020). In case the irradiation phase has completed (e.g., by completing all tasks included in the treatment plan or responsive to an abort), the method commences at box 5070.

At box 5070, reporting on the irradiation event can be implemented. Such reporting can include drawing up a medical report. The medical report can include details of the irradiation event. For instance, the dose delivered, details of the treatment site, or any follow-up diagnosis can be included in the medical report. In some scenarios, the medical report may be drawn up at least partially automated, e.g., based on treatment parameters that are derived from the supervision of the irradiation, e.g., as described in connection with box 5050, box 5055, at box 5060.

It would be possible that the medical report is drawn up at the server, e.g., by the application 61.

It would also be possible that values of device parameters observed during the irradiation that has been executed are included in the treatment report.

The treatment report and/or the medical report can be provided to a data repository such as the data repository 96.

A digital signature of the treatment report and/or the medical report may be provided, e.g., based on access credentials of the users involved in the approval of the treatment plan and/or the supervision of the irradiation (cf. box 5045, box 5055, box 5060).

Summarizing, in FIG. 6 aspects have been illustrated with respect to performing control of the RTMD in connection with a radiation therapy event. Variations of the sequence of boxes are possible. Furthermore, it is not required in all scenarios that all boxes of FIG. 6 are executed. For instance, in FIG. 6 a scenario is illustrated in which the data connection is established at box 5010 during the planning phase 3005. However, in some scenarios, it would be possible that the data connection is established during each one of the executed phases of the radiation event and respectively released at the end of that phase. For instance, the data connection may be established at the beginning of the planning phase and then released at the end of the planning phase. Then, the data connection may be (re-)established at the beginning of the pre-irradiation phase, sometime later, e.g., at the next day or the next week.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

The invention claimed is:

1. A computer-implemented method, comprising:
   at a server, establishing a data connection with a radiation therapy medical device via the Internet,
   at the server, executing an application for remote configuration of multiple device parameters of the radiation therapy medical device, wherein the application provides a user interface for displaying and adjusting values of the multiple device parameters, and
   while the application is being executed, implementing a repetitive bi-directional synchronization of the values of the multiple device parameters between the application and the radiation therapy medical device via the data connection,
      wherein said implementing of the repetitive bi-directional synchronization comprises, at the radiation therapy medical device: monitoring for changes of the values of the multiple device parameters in a control software executed by an embedded software control module of the radiation therapy medical device and responsive to detecting a change of a given value of a given device parameter of the multiple device parameters, providing the server with a push notification of the change of the given value.

2. The computer-implemented method of claim 1,
   wherein the multiple device parameters comprise one or more threshold settings for the values of one or more further device parameters of the multiple device parameters,
   wherein the method further comprises:
      monitoring that the values of the one or more further device parameters adjusted via the user interface are compliant with the values of the one or more threshold settings.

3. The computer-implemented method of claim 1,
   wherein said implementing of the repetitive bi-directional synchronization comprises, at the radiation therapy medical device: obtaining, from the server, a notification of a change of a given value of a given device parameter of the multiple device parameters,
   wherein the method further comprises:
      at the radiation therapy medical device: based on the notification of the change of the given values, providing, to an embedded software control module, a request for reconfiguring the given value in a control software executed by the embedded software control module, and
      the embedded software control module monitoring that the given value is compliant with one or more hardcoded threshold settings associated with the given value.

4. The computer-implemented method of claim 1,
   wherein said implementing of the repetitive bi-directional synchronization comprises, at the radiation therapy medical device: obtaining, from the server, a notification of a change of a given value of a given device parameter of the multiple device parameters, wherein the method further comprises:
obtaining, at the radiation therapy medical device and from a human machine interface, a request for a further change of the given value of the given device parameter,
performing a conflict resolution with respect to the change and the further change of the given value of the given device parameter based on at least one criterion,
wherein the at least one criterion is optionally selected from the group comprising: user rights associated with different users associated with the change and the further change; a predetermined priority associated with a local adjustment of the values of the multiple device parameters versus a remote adjustment of the values of the multiple device parameters; or timestamps associated with the change and the further change.

5. The computer-implemented method of claim 1,
wherein the multiple device parameters comprise a process identifier identifying a radiation therapy event at the radiation therapy medical device,
wherein the multiple device parameters further comprise a progress indication associated with the process identifier and indicative of a current phase of the respective radiation therapy event, a value of the progress indication varying between at least a planning phase, a pre-irradiation phase, and an irradiation phase,
wherein functionalities provided by the user interface are re-configured in accordance with the value of the progress indication.

6. The computer-implemented method of claim 5, further comprising:
responsive to the value of the progress indication corresponding to the pre-irradiation phase: looking-up, in a data repository, contact details of multiple parties associated with the radiation therapy event, and establishing a conference call based on the contact details.

7. The computer-implemented method of claim 6,
wherein the contact details comprise routing addresses of a conference call application executed on mobile devices of the multiple parties.

8. The computer-implemented method of claim 6,
wherein the multiple parties are predetermined in accordance with an approval scheme defined by the multiple device parameters.

9. The computer-implemented method of claim 1,
wherein said establishing of the data connection comprises: the server transmitting, to the radiation therapy medical device or to another server, a connection establishment request message, the connection establishment request message being associated with access credentials of the server.

10. The computer-implemented method of claim 1, further comprising:
obtaining, from the radiation therapy medical device or from a data repository or from another server, multiple user identities of users authorized to access the application, and
checking access rights of users attempting to access the user interface based on the multiple user identities.

11. The computer-implemented method of claim 1, further comprising:
at the server: receiving, from the radiation therapy medical device, a data stream comprising a sequence of data frames, each data frame comprising updated values of one or more operational parameters of the radiation therapy medical device during an irradiation phase of a radiation therapy event at the radiation therapy medical device,
wherein the user interface is provided for supervising the irradiation phase based on the values of the one or more operational parameters.

12. The computer-implemented method of claim 11, further comprising:
at the server: monitoring an integrity of the data stream during the irradiation phase and responsive to detecting that the integrity is compromised, transmitting, to the radiation therapy medical device an abort command to abort the irradiation phase.

13. The computer-implemented method of claim 12,
wherein the data stream is implemented on the data connection,
wherein the abort command is transmitted using an alternative data connection.

14. The computer-implemented method of claim 1, further comprising:
at the radiation therapy medical device: transmitting, to the server, a data stream comprising a sequence of data frames, each data frame comprising updated values of one or more operational parameters of the radiation therapy medical device during an irradiation phase of a radiation therapy event at the radiation therapy medical device,
monitoring for acknowledgements of the data frames of the sequence of data frames, and
based on said monitoring, selectively aborting the irradiation phase.

15. The computer-implemented method of claim 1,
wherein the application is executed during at least one of a planning phase, in which a treatment plan is created, a pre-irradiation phase, in which the treatment plan is confirmed, or an irradiation phase according to the treatment plan, of a radiation therapy event at the radiation therapy medical device.

16. A server comprising at least one processor and a memory, wherein the at least one processor is configured to load program code from the memory and execute the program code, wherein the at least one processor, upon executing the program code, is configured to:
establish a data connection with a radiation therapy medical device via the Internet,
execute an application for remote configuration of multiple device parameters of the radiation therapy medical device, wherein the application provides a user interface for displaying and adjusting values of the multiple device parameters, and
while the application is being executed, implement a repetitive bi-directional synchronization of the values of the multiple device parameters between the application and the radiation therapy medical device via the data connection,
wherein said implementing of the repetitive bi-directional synchronization comprises, at the radiation therapy medical device: monitoring for changes of the values of the multiple device parameters in a control software executed by an embedded software control module of the radiation therapy medical device and responsive to detecting a change of a given value of a given device parameter of the multiple device parameters, providing, to the server a push notification of the change of the given value.

17. A system, comprising the server of claim 16 and the radiation therapy medical device.

\* \* \* \* \*